United States Patent [19]

Meer

[11] 3,753,805

[45] Aug. 21, 1973

[54] METHOD OF PRODUCING PLANAR, DOUBLE-DIFFUSED SEMICONDUCTOR DEVICES

[75] Inventor: Winfried Meer, Hohenbrunn, Germany

[73] Assignee: Siemens Aktiengesellschaft, Munich and Berlin, Germany

[22] Filed: Feb. 19, 1968

[21] Appl. No.: 706,539

[30] Foreign Application Priority Data

Feb. 23, 1967 Germany ............ S108474

[52] U.S. Cl. ............ 148/187

[51] Int. Cl. ............ H01l 7/02

[58] Field of Search ............ 148/187, 189, 190, 148/175; 23/191; 29/578; 317/235, 46.5

[56] References Cited

UNITED STATES PATENTS

| | | | |
|---|---|---|---|
| 3,484,313 | 12/1969 | Tauchi et al. | 148/187 |
| 3,597,667 | 8/1971 | Horn | 317/235 |
| 3,477,886 | 11/1969 | Ehlenberger | 148/187 |
| 3,438,873 | 4/1969 | Schmidt | 29/578 X |
| 3,537,921 | 11/1970 | Boland | 148/187 X |
| 3,510,369 | 5/1970 | Ernick et al. | 148/175 |
| 3,331,716 | 7/1967 | Bloem et al. | 148/187 X |
| 3,342,650 | 9/1967 | Seki et al. | 148/187 |
| 3,388,000 | 6/1968 | Waters et al. | 148/187 X |
| 3,432,920 | 3/1969 | Rosenzweig | 148/187 X |
| 3,437,533 | 4/1969 | Dingwall | 148/189 X |

*Primary Examiner*—Allen B. Curtis
*Attorney*—Curt M. Avery, Arthur E. Wilfond, Herbert L. Lerner and Daniel J. Tick

[57] ABSTRACT

Described is method of producing double-diffused semiconductor devices, preferably of germanium, having at least three zones of alternately different conductance. These zones are produced by indiffusion of dopants, into the semiconductor body in accordance with the steps of the planar technique. The process is characterized by applying at least two insulating layers, which resist the diffusion temperature, to the surface of the semiconductor body prior to the diffusion. The combination of said insulating layers is so selected that they show variable masking properties with respect to the substances to be indiffused and may be comprised of a $SiO_2$ layer and a $Si_3N_4$ layer.

3 Claims, 9 Drawing Figures

METHOD OF PRODUCING PLANAR, DOUBLE-DIFFUSED SEMICONDUCTOR DEVICES

Figure 1:
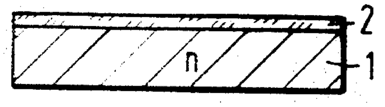

My invention relates to a method of producing double-diffused semiconductor devices, preferably of germanium, having at least three zones of alternately different conductance. These zones are produced by in-diffusing dopants, which determine the conductivity type into the semiconductor body, in accordance with steps used in planar technique.

It is known in the production of high frequency transistors, particularly those of germanium, to use gallium and zinc to produce a p-doped region for emitter diffusion in (pnp) transistors and base diffusion in (npn) transistors. However, these elements have the disadvantage that they are insufficiently if at all, masked by a masking layer such as $SiO_2$, which prior to the diffusion processes is precipitated on the germanium semiconducting surface. Thus with the aforementioned elements, it is impossible to produce planar structures in germanium semiconductor bodies.

It is also known that a $Si_3N_4$ layer possesses optimum masking properties, particularly for gallium. Therefore, in order to produce semiconductor components by the planar technique, with gallium as a dopant, the semiconductor surface must be sequentially provided with a $SiO_2$ cover or mask and with a $Si_3N_4$ cover or mask with the required diffusion steps carried out between the production of the individual cover layers. For example, in the production of the emitter region in pnp transistors, a partial separation of the cover ie necessary. Due to the plurality of production steps, particularly when germanium is the base substance, the diffusion data is greatly changed mainly because of the subsequent process steps being conducted at high temperatures, resulting in a considerable impairment of the electrical parameters of the thus produced semiconductor devices.

My invention has among its objects the simplification of the manufacturing process in the production of planar transistors, particularly germanium transistors, and the production of npn or pnp structures in the best possible way by utilizing the masking properties of $Si_3N_4$ layers.

I achieve this end by prior to the diffusion steps, applying to the surface of the semiconductor body at least two insulating layers which remain stable at the diffusion temperatures utilized. The combination of insulating layers is so selected as to provide variable masking properties with respect to the indiffused materials.

A further development of this invention is to use a combination of $SiO_2$ and $Si_3N_4$ for the insulating layers by precipitating the $SiO_2$ layer first, followed by precipitating the $Si_3N_4$ layer.

The individual layers are precipitated by pyrolysis of the corresponding organic compounds. For example, the $SiO_2$ layer is precipitated, through a pyrolysis of tetraethoxysilane, $Si(OC_2H_5)_4$ at 600° – 700° C while the $Si_3N_4$ layer is precipitated through pyrolysis of trisdiethylaminosilane, $SiH(N(C_2H_5)_2)_3$ at approximately 500° C. The $SiO_2$ layer may also be formed through a reaction of tetrachlorosilane, $SiCl_4$, with carbon dioxide, $CO_2$, at 800°C. The $Si_3N_4$ layer may also be formed by pyrolysis of silane, $SiH_4$, or silicochloroform, $SiHCl_3$, in the presence of ammonia, $NH_3$, at temperatures from 400° to 500° C.

According to a particularly preferred embodiment example, the $SiO_2$ layer is precipitated at a layer 0.15 μ thick and the $Si_3N_4$ in a layer 0.05 μ thick.

It is also within the framework of this invention to in-diffuse the dopants, which determine the respective regions, into the semiconductor body in a single method step. This simultaneous diffusion of n and p dopants largely eliminates changes in diffusion data which occur in known methods, by the required subsequent processes conducted at high temperatures.

Another advantage of my invention is that when several diffusion steps are necessary, the production of a new diffusion mask between individual diffusion processes as required by previous technique may be avoided. Furthermore, it is not necessary to produce the insulation layer which is sometimes necessary following diffusion, and prior to the vapor deposition of the contacts.

One embodiment of the present invention is to cover or coat the semiconductor with a layer of a foreign oxide and a foreign nitride. For example, germanium can be covered with a $SiO_2$ layer and a $Si_3N_4$ layer. It is also possible in the same manner, to precipitate other layers with partial masking properties or to use other semiconductors, e.g. $A^{III}B^{V}$ compounds, as the base or substrate layer.

My method is the first to succeed in producing double-diffused planar germanium transistors by using gallium as the dopant, in a single diffusion process. The present invention may also be used to advantage for producing integrated circuits, containing planar germanium transistors.

Specific details of my invention can be seen from the embodiment examples with reference to the drawing wherein FIGS. 1–5 show the manufacture of an npn double-diffused planar germanium transistor in accordance with the present invention; and FIGS. 6 to 9 disclose another embodiment for the production of a pnp double-diffused planar germanium transistor in accordance with the present invention.

Figure 2:
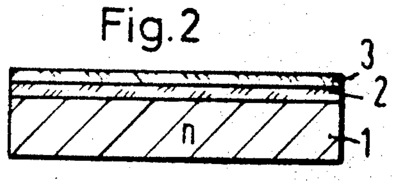
Figure 3:
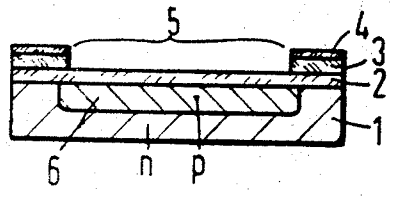
Figure 4:
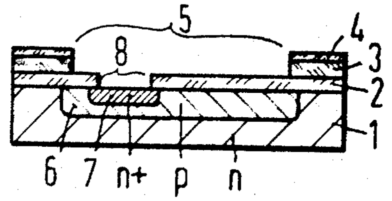
Figure 5:
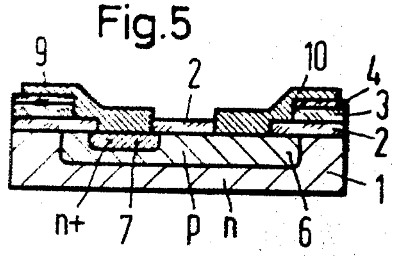

FIG. 1 shows an n-conducting semiconductor crystal disc 1 of a germanium wherein an approximately 0.15 μ thick $SiO_2$ layer 2 is precipitated through pyrolysis of tetraethyoxysilane, $Si(OC_2H_5)_4$ at approximately 700°C. In FIG. 2 an approximately 0.05 μ thick $Si_3N_4$ layer 3 is applied to said $SiO_2$ layer 2 by pyrolysis of trisdiethylaminosilane, $SiH(N(C_2H_5)_2)_3$, at 500° C. Another $SiO_2$ layer 4 is applied upon the $Si_3N_4$ layer 3 as an etching mask for the $Si_3N_4$ layer 3. A window 5 is etched into layers 3 and 4 by the known photo resist method. As shown in FIG. 3, after the remaining photo resist is removed a p-doped region 6 using gallium as the dopant is indiffused through window 5. The $SiO_2$ layer 4 serves only as an etching mask for etching the base diffusion window 5 by a phosphoric acid solution at 180°C into the $Si_3N_4$ layer 3, and may possibly be substituted by a heat-resistant photo resist. As the diffusion is masked only by the remaining $Si_3N_4$ layer 3, it is not necessary to remove the $SiO_2$ layer 2, lying beneath the $Si_3N_4$ layer 3. FIG. 4 shows the production of the emitter region 7 by indifussion of arsenic through window 8, etched into the $SiO_2$ layer 2 by the photo technique using a dilute hydrofluoric acid solution buffered by ammonium flouride. FIG. 5 shows the finished transistor which was completed by etching an additional window into the $SiO_2$ layer 2 for the base terminal and thereafter vapor depositing metal contacts 9 and 10 through the remaining regions of insulation layer 2 and 3. The collector terminal is located on the bottom side of the semiconductor crystal disc 1 and is not shown in the FIG. Otherwise, the reference numerals are the same as used in FIG. 4.

Figure 6:
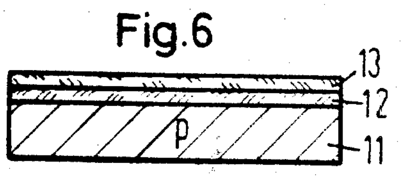
Figure 7:
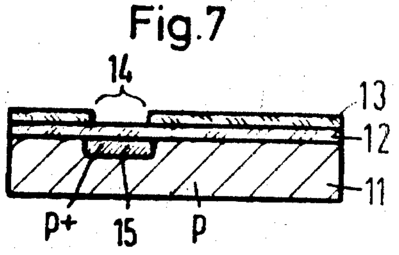
Figure 8:
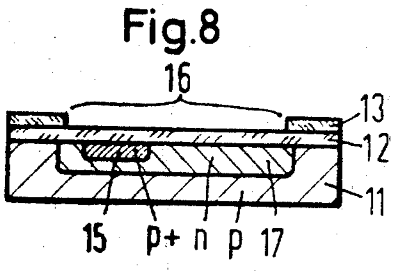
Figure 9:
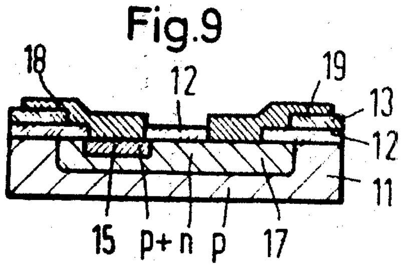

FIG. 6 shows the two first production steps for the production of a pnp double-diffused planar transistor of germanium with one unmasked, and one masked, insulating layer. An unmasked layer 12, for example, crystalline $SiO_2$, is precipitated, as described above, upon a p-conducting crystal disc 11 of germanium. A masked insulation layer 13 is applied, for example $Si_3N_4$ is pyrolytically precipitated as described above, upon the $SiO_2$ layer 12. By using the known photo resist method, and possibly an $SiO_2$ layer (not shown) as an etching mask, window 14 is etched into the masking $Si_3N_4$ layer 13 by a phosphoric acid solution at 180°. The emitter region 15 is produced by gallium indiffusion to give the device shown in FIG. 7. After providing a window 16 for the base region by removing the $Si_3N_4$ layer 13 and the $SiO_2$ layer 12 thereat, the base region 17 is produced by indifussion of arsenic to provide the device shown in FIG. 8. In FIG. 9 the finished pnp double-diffused germanium transistor is shown after again producing $SiO_2$ layer 12 by oxidation and etching of contact terminal windows into the $SiO_2$ layer 12, contact leads 18 and 19 are vapor deposited through the remaining insulating layers 12 and 13 to give the emitter and the base contacts, as described in FIG. 5. The same numerals are used as in FIG. 8.

I claim:

1. The method of producing double-diffused germanium semiconductor devices, having at least three zones of alternately different conductance types, produced by indiffusion of dopants, into the germanium semiconductor body which comprises applying at least two of the insulating layers, which remain constant at the diffusion temperature, to the surface of the germanium semiconductor body, the combination of said insulating layers being an $SiO_2$ layer and an $Si_3N_4$ layer, said $SiO_2$ layer is first precipitated in a layer thickness of 0.15$\mu$ and thereafter the $Si_3N_4$ layer is precipitated, said insulating layers showing variable masking properties with respect to the substances to be indiffused and thereafter indiffusing the dopants through a window in the $Si_3N_4$ layer and through the $SiO_2$ layer.

2. The method of claim 1, wherein the $Si_3N_4$ layer is applied to a thickness of 0.05 $\mu$.

3. The method of claim 1, wherein the indiffusion into the semiconductor body of the dopant determining the respective zones is effected in a single method step.

* * * * *